United States Patent
Uchida et al.

(10) Patent No.: US 7,799,686 B2
(45) Date of Patent: Sep. 21, 2010

(54) MATERIALS FOR POLISHING LIQUID FOR METAL, POLISHING LIQUID FOR METAL, METHOD FOR PREPARATION THEREOF AND POLISHING METHOD USING THE SAME

(75) Inventors: Takeshi Uchida, Tsukuba (JP); Tetsuya Hoshino, Hitachi (JP); Hiroki Terazaki, Tsukuba (JP); Yasuo Kamigata, Tsukuba (JP); Naoyuki Koyama, Tsukuba (JP); Yoshio Honma, Kokubunji (JP); Seiichi Kondoh, Kokubunji (JP)

(73) Assignees: Hitachi, Ltd., Tokyo (JP); Hitachi Chemical Company, Ltd., Tokyo (JP)

( * ) Notice: Subject to any disclaimer, the term of this patent is extended or adjusted under 35 U.S.C. 154(b) by 586 days.

(21) Appl. No.: 11/715,843

(22) Filed: Mar. 9, 2007

(65) Prior Publication Data

US 2007/0167017 A1    Jul. 19, 2007

Related U.S. Application Data

(62) Division of application No. 09/869,347, filed as application No. PCT/JP99/07402 on Dec. 28, 1999, now Pat. No. 7,250,369.

(30) Foreign Application Priority Data

Dec. 28, 1998  (JP)  ................................. 10-372605
Dec. 28, 1998  (JP)  ................................. 10-372608

(51) Int. Cl.
*H01L 21/00* (2006.01)
(52) U.S. Cl. ........................ 438/690; 438/692; 438/693
(58) Field of Classification Search ................. 438/690, 438/692, 693
See application file for complete search history.

(56) References Cited

U.S. PATENT DOCUMENTS

| | | | |
|---|---|---|---|
| 4,683,071 A | | 7/1987 | Regenass et al. |
| 5,093,001 A | | 3/1992 | Ueda |
| 5,527,423 A | | 6/1996 | Neville et al. |
| 5,575,885 A | | 11/1996 | Hirabayashi et al. |
| 5,607,718 A | | 3/1997 | Sasaki et al. |
| 5,676,847 A | | 10/1997 | Yamamoto et al. |
| 5,770,095 A | | 6/1998 | Sasaki et al. |
| 5,840,629 A | | 11/1998 | Carpio |
| 5,858,813 A | | 1/1999 | Scherber et al. |
| 5,954,997 A | | 9/1999 | Kaufman et al. |
| 6,072,098 A | | 6/2000 | Takagawa et al. |
| 6,117,775 A | | 9/2000 | Kondo et al. |
| 6,225,681 B1 * | | 5/2001 | Chungpaiboonpatana et al. ................. 257/642 |
| 6,426,294 B1 | | 7/2002 | Hirabayashi et al. |
| 6,546,939 B1 | | 4/2003 | Small |
| 6,632,377 B1 * | | 10/2003 | Brusic et al. ............. 252/79.1 |
| 6,825,120 B1 * | | 11/2004 | Liu et al. .................. 438/693 |
| 6,896,825 B1 * | | 5/2005 | Uchida et al. ............. 252/79.1 |
| 6,899,821 B2 * | | 5/2005 | Uchida et al. ............. 252/79.1 |
| 7,144,802 B2 * | | 12/2006 | Xia et al. .................. 438/618 |
| 7,188,630 B2 * | | 3/2007 | Flake et al. ............... 134/1.3 |
| 7,232,529 B1 * | | 6/2007 | Uchida et al. ............. 252/79.1 |
| 7,250,369 B1 * | | 7/2007 | Uchida et al. ............. 438/692 |
| 7,300,602 B2 * | | 11/2007 | Liu et al. .................. 252/79.1 |
| 7,435,356 B2 * | | 10/2008 | Ghosh et al. .............. 252/79.1 |
| 7,442,636 B2 * | | 10/2008 | Hillman .................... 438/622 |
| 7,550,046 B2 * | | 6/2009 | Xia et al. .................. 118/715 |
| 7,579,279 B2 * | | 8/2009 | Flake et al. ............... 438/690 |
| 2004/0147118 A1 * | | 7/2004 | Liu et al. .................. 438/689 |
| 2004/0194392 A1 * | | 10/2004 | Takemiya et al. ............. 51/307 |
| 2004/0224521 A1 * | | 11/2004 | Flake et al. ............... 438/692 |
| 2005/0205207 A1 * | | 9/2005 | Minamihaba et al. ... 156/345.12 |
| 2006/0068589 A1 * | | 3/2006 | Bian ......................... 438/689 |
| 2006/0110924 A1 * | | 5/2006 | Ghosh et al. .............. 438/692 |
| 2006/0131275 A1 * | | 6/2006 | Bian ............................. 216/88 |
| 2006/0216939 A1 | | 9/2006 | Uchida et al. |
| 2006/0270233 A1 * | | 11/2006 | Xia et al. .................. 438/690 |
| 2007/0004210 A1 * | | 1/2007 | Takemiya et al. .......... 438/692 |
| 2007/0128872 A1 * | | 6/2007 | Itoh et al. .................. 438/691 |
| 2007/0167017 A1 * | | 7/2007 | Uchida et al. ............. 438/692 |
| 2007/0235061 A1 * | | 10/2007 | Mizuta et al. ................. 134/2 |
| 2007/0290166 A1 * | | 12/2007 | Liu et al. .................. 252/79.2 |
| 2008/0038994 A1 * | | 2/2008 | Flake et al. ................. 451/36 |
| 2008/0047490 A1 * | | 2/2008 | Xia et al. .................. 118/719 |
| 2008/0105651 A1 * | | 5/2008 | Mabuchi et al. ............. 216/89 |
| 2008/0119052 A1 * | | 5/2008 | Liu et al. .................. 438/693 |
| 2009/0311864 A1 * | | 12/2009 | Yamada et al. ............. 438/693 |

FOREIGN PATENT DOCUMENTS

| | | |
|---|---|---|
| EP | 0 844 290 A1 | 5/1998 |
| EP | 0 846 742 | 6/1998 |
| JP | 01-219171 | 9/1989 |
| JP | 06-254764 A | 9/1994 |
| JP | 08-064594 | 3/1996 |
| JP | 08-083780 | 3/1996 |
| JP | 08-283967 | 10/1996 |
| JP | 09-148286 | 6/1997 |

(Continued)

OTHER PUBLICATIONS

Japanese Official Action issued Nov. 4, 2009, for Application No. 2007-293650.

(Continued)

*Primary Examiner*—Laura M Menz
(74) *Attorney, Agent, or Firm*—Antonelli, Terry, Stout & Kraus, LLP.

(57) ABSTRACT

Provided are a metal-polishing liquid that comprises an oxidizing agent, an oxidized-metal etchant, a protective film-forming agent, a dissolution promoter for the protective film-forming agent, and water; a method for producing it; and a polishing method of using it. Also provided are materials for the metal-polishing liquid, which include an oxidized-metal etchant, a protective film-forming agent, and a dissolution promoter for the protective film-forming agent.

35 Claims, No Drawings

FOREIGN PATENT DOCUMENTS

| | | |
|---|---|---|
| JP | 10-022241 | 1/1998 |
| JP | 10-116804 | 5/1998 |
| JP | 10-163141 | 6/1998 |
| JP | 10-163142 | 6/1998 |
| JP | 10-287865 | 10/1998 |
| JP | 10-310766 | 11/1998 |
| JP | 2000-252242 A | 9/2000 |
| JP | 2000-252243 A | 9/2000 |
| JP | 2000-252244 A | 9/2000 |
| JP | 2000-336345 A | 12/2000 |
| JP | 2001-068437 A | 3/2001 |
| JP | 2001-085372 A | 3/2001 |
| JP | 2001-127023 A | 5/2001 |
| JP | 2001-139937 A | 5/2001 |
| JP | 2001-144042 A | 5/2001 |
| JP | 2001-144045 A | 5/2001 |
| JP | 2001-144046 A | 5/2001 |
| JP | 2002-134442 A | 5/2002 |
| JP | 2002-198332 A | 7/2002 |
| JP | 2002-198333 A | 7/2002 |
| JP | 2002-280336 A | 9/2002 |
| KR | 1998-024900 | 7/1998 |
| TW | 145959 | 11/1990 |
| TW | 259721 | 10/1995 |
| WO | WO 98/08693 | 3/1998 |
| WO | WO 98/13536 | 4/1998 |
| WO | WO 98/18159 | 4/1998 |
| WO | WO 98-26025 | 6/1998 |
| WO | WO 98/49723 | 11/1998 |

OTHER PUBLICATIONS

European Official Action issued Dec. 7, 2009, for Application No. 99 961 474.6-1235.
Office Action dated May 2, 2002 from Taiwanese Patent Office.
Korean Office Action dated Dec. 17, 2004, for Korean Application No. 10-2004-7006420.
Supplementary European Search Report, for Application No. 99 96 1474, dated Apr. 27, 2005.
European Office Action mailed Nov. 16, 2006, in EP 99 961 474.6-1235.
Japanese Official Action issued on Dec. 15, 2009, for Application No. 2007-293647.
European Official Action mailed Apr. 8, 2009, for Application No. 99 961 474.6-1235.
Q. Luo, et al., "Chemical-Mechanical Polishing of Copper in Acidic Media", CMP-MIC Conference, Feb. 22-23, 1996 (1996 ISMIC) (XP-002965484), pp. 145-151.
Japanese Official Action issued May 19, 2009, for Application No. 2003-371451.
Japanese Official Action issued Jul. 14, 2009, for Application No. 2000-591657.
Extended European Search Report for Application No. EP 07 10 8615, dated Aug. 9, 2007.
Japanese Official Action for Application No. 2000-591657, dated Sep. 11, 2007.
Third party submission issued Mar. 26, 2010, in counterpart Japanese Application No. 2000-591657.
European Search Report dated May 4, 2010, for Application No. 10157271.7-1235.
R. Goetz, et al., "An AES and SIMS Study of the Influence of Chloride on the Passive Oxide Film on Iron", *Electrochimica Acia*, vol. 31, No. 10, 1986, pp. 1299-1303.
Third-party Submission issued May 25, 2010, for Japanese Application No. 2007-293647.
Third-party Submission issued May 25, 2010, for Japanese Application No. 2007-293650.
"Dictionary of Chemistry", published by Tokyo kagaku doujjin Co., Ltd., p. 2185.
Japanese Official Action issued Jun. 22, 2010, for Japanese Application No. 2007-293650.
Japanese Official Action issued Jun. 15, 2010, for Japanese Application No. 2007-293647.

* cited by examiner

MATERIALS FOR POLISHING LIQUID FOR METAL, POLISHING LIQUID FOR METAL, METHOD FOR PREPARATION THEREOF AND POLISHING METHOD USING THE SAME

This application is a Divisional application of application Ser. No. 09/869,347, filed Sep. 7, 2001, now U.S. Pat. No. 7,250,369 the contents of which are incorporated herein by reference in their entirety. Ser. No. 09/869,347 is a National Stage Application of international (PCT) Application No. PCT/JP99/07402, filed Dec. 28, 1999.

TECHNICAL FIELD

The present invention relates to a metal-polishing liquid especially favorable for steps of wiring semiconductor devices, and to a polishing method of using the metal-polishing liquid.

BACKGROUND ART

Various new microfabrication techniques have been being developed to satisfy the recent requirements of increased integration and advanced performance of large-scale integrated circuits (hereinafter referred to as LSI) of semiconductor devices. Chemical mechanical polishing (hereinafter referred to as CMP) is one of them, and this is frequently utilized in LSI production, especially for insulating interlayer planarization, metal plug formation, buried wiring pattern formation and the like in multi-level interconnection, for LSI production. This technique is disclosed, for example, in U.S. Pat. No. 4,944,836.

Recently, copper alloys have been being tried for interconnection to realize high-performance LSI. However, copper alloys are difficult to use in a process of dry-etching microfabrication that is frequently used in interconnection with conventional aluminum alloys. For this reason, a damascene process is essentially employed for microfabrication with such copper alloys, which comprises depositing a thin film of a copper alloy on an insulating film having grooves previously formed therein, to thereby bury the copper alloy in the grooves, and thereafter removing the thin copper alloy film not buried in the grooves through CMP to form a buried wiring pattern of the copper alloy. This technique is disclosed, for example, in Japanese Patent Laid-Open No. 2-278822.

One general method of CMP of metal comprises sticking a polishing pad on a circular platen, soaking it in a metal-polishing liquid, setting a substrate having a metal film formed thereon to the polishing pad to keep the metal film in contact with the pad, and rotating the platen while a predetermined pressure (this is hereinafter referred to as a polishing pressure) is applied to its back to thereby remove the excess metal film owing to the mechanical friction between the polishing liquid and the hilled area of the metal film.

The metal-polishing liquid for CMP generally comprises an oxidizing agent and solid abrasive grains, optionally containing an oxidized-metal etchant and a protective film-forming agent. It is considered that the basic mechanism of CMP comprises oxidizing the surface of a metal film followed by scraping away the oxidized layer from the metal film by the action of solid abrasive grains. In the process of CMP, the oxidized layer of the metal surface in the grooved area of the metal film is not almost brought into contact with the polishing pad and is therefore almost free from the scraping action of the solid abrasive grains. Accordingly in this, the metal layer in the hilled area is removed through CMP, and the surface of the substrate is thereby planarized. The details of the process are disclosed in Journal of Electrochemical Society, Vol. 138, No. 11 (issued in 1991), pp. 3460-3464.

It is generally said that an oxidized-metal etchant, if added to the metal-polishing liquid, is effective for increasing the polishing rate in CMP. For the reason, it is understood that the oxidized-metal etchant added dissolves the metal oxide particles having been scraped off by the solid abrasive grains in the metal-polishing liquid to thereby enhance the scraping ability of the solid abrasive grains. The metal-oxide etchant added increases the polishing rate in CMP, while, on the other hand, it etches even the oxidized layer of the metal film surface in the grooved area. As a result, the metal film surface in that area is exposed, and it is then further oxidized with the oxidizing agent. After this is repeated, the metal film in the grooved area is thereby much etched. Accordingly, in a case where such an oxidized-metal etchant is added to a metal-polishing liquid, the center part of the surface is depressed like a dish (this phenomenon is hereinafter referred to as dishing) and therefore could not be well planarized. To avoid this, a protective film-forming agent may be added to the metal-polishing liquid. In the metal-polishing liquid containing such a protective film-forming agent, it is important to well balance the effect of the oxidized-metal etchant with that of the protective film-forming agent in order that the etchant does not so much etch the oxidized layer of a metal film surface in the grooved area thereof but can efficiently dissolve the scraped oxidized layer particles so as to increase the polishing rate in CMP.

Adding such an oxidized-metal etchant and a protective film-forming agent to a metal-polishing liquid to expect their chemical reactions increases the CMP rate (that is, the polishing rate in CMP) and is effective for reducing the damage of the metal layer surface polished through CMP.

However, the following problems (1) to (4) are inevitable in the process of buried wiring pattern formation through CMP with a conventional metal-polishing liquid that contains solid abrasive grains.

(1) The center part of the surface of the buried metal, wiring pattern is isotropically etched (dishing).

(2) The surface polished with the liquid is scratched by the solid abrasive grains.

(3) After polished, the surface must be washed to remove the solid abrasive grains still retaining thereon, but the washing operation is troublesome.

(4) The solid abrasive grains are expensive, and the waste treatment is costly. Accordingly, the cost of the CMP process itself is high.

In addition, most of the metal-polishing liquid is water. Therefore, the tank for transporting the liquid therein must be large, and the tank for storing it in a polishing plant must be also large. That is, the metal-polishing liquid requires a large space for producing, storing, transporting and using it, and this is a bar to automation in using the liquid in a polishing plant. Moreover, the cost of recycling the tanks used for transporting the liquid is extremely high, and this is still another problem.

The problems may be solved if a concentrate of the metal-polishing liquid not containing a large amount of solid abrasive grains can be prepared. The production costs in metal-polishing liquid makers could be reduced, and, as a result, the costs of the dilutions of the concentrate could also be reduced. In addition, mass-production of the concentrate does not require increasing the scale of the existing production plants, for which, therefore, no additional capital investment is needed. This is another advantage of the concentrate. In view of the advantages in using it, the concentrate is preferably prepared to have a degree of concentration of at least 10 times that of the diluted liquid thereof to be actually used in metal polishing.

On the other hand, for LSI interconnection of high reliability with neither dishing nor copper alloy etching in the polishing process, proposed is a method of using a metal-polishing liquid that comprises aminoacetic acid e.g., glycine or amidosulfuric acid serving as an oxidized-metal etchant, and benzotriazole (hereinafter referred to as BTA) serving as a protective film-forming agent. This technique is described, for example, in Japanese Patent Laid-Open No. 8-83780.

However, since the solubility in water of BTA is low (2 g in 100 cc of 20° C. water), some metal-polishing liquids of that type could not be concentrated into 10-fold concentrates (for example, the metal-polishing liquid containing 0.2% by weight of BTA can be concentrated into 5-fold concentrates, but if concentrated into 10-fold concentrates, BTA is deposited therein at 0° C. or lower). Accordingly, desired is a metal-polishing liquid containing BTA and capable of being concentrated into 10-fold or more concentrates, not forming a deposit of BTA in the concentrates even in ordinary environments at 0° C. or higher.

DISCLOSURE OF THE INVENTION

One object of the present invention is to provide a metal-polishing liquid capable of being readily prepared by diluting a metal-polishing liquid material of high concentration and capable of realizing the formation of buried metal film patterns of high reliability. Another object of the invention is to provide a method for producing the metal-polishing liquid; a metal-polishing liquid material to be used in the method; and a polishing method of using the polishing liquid.

To attain the objects as above, the invention provides a metal-polishing liquid that comprises an oxidizing agent, an oxidized-metal etchant, a protective film-forming agent, a dissolution promoter for the protective film-forming agent, and water.

The metal-polishing liquid of the invention may contain abrasive grains, but may not substantially contain solid abrasive grains. In the case where it contains solid abrasive grains, it is possible to perform high-speed polishing. In the case where it does not contain solid abrasive grains, abrasive scratches are drastically reduced since CMP without solid abrasive grains is attained by friction to a polishing pad that is mechanically far softer than solid abrasive grains.

As a material for preparing the metal-polishing liquid of the invention, herein provided is a metal-polishing liquid material that comprises an oxidized-metal etchant, a protective film-forming agent and a dissolution promoter for the protective film-forming agent. The metal-polishing liquid material of the invention may further contain an oxidizing agent, water and/or abrasive grains.

It is easy to prepare a metal-polishing liquid from the metal-polishing liquid material of the invention by diluting the material and optionally adding thereto any additional ingredients. For this, the invention provides a method for producing a metal-polishing liquid that comprises a step of diluting the metal-polishing liquid material of the intention with a diluent.

For the diluent, preferred is water or an aqueous diluent solution. The aqueous diluent solution preferably contains at least one of an oxidizing agent, an oxidized-metal etchant, a protective film-forming agent and a dissolution promoter for the protective film-forming agent. The above-mentioned dilution step in the method may be for diluting the metal-polishing liquid material that contains at least one ingredient of an ingredient group consisting of an oxidizing agent, an oxidized-metal etchant, a protective film-forming agent and a dissolution promoter for the protective film-forming agent, with an aqueous diluent solution of at least one ingredient of the ingredient group.

The metal-polishing liquid material of the invention may be a composition prepared by mixing all the constituent ingredients, or may be a combination of at least two compositions each containing any of the constituent ingredients. Concretely, for example, the metal-polishing liquid material of the invention may be composed of a first constituent element and a second constituent element not mixed as yet. In this, the first constituent element contains at least one ingredient of an ingredient group consisting of an oxidizing agent, an oxidized-metal etchant, a protective film-forming agent and a dissolution promoter for the protective film-forming agent; and the second constituent element contains the other ingredients of the ingredient group.

For preparing a metal-polishing liquid from the metal-polishing liquid material that comprises at least two constituent elements as above, the invention herein provides a method that comprises a step of mixing the above-mentioned first and second constituent elements and a diluent in any desired order. The order of mixing them is not specifically defined, and may be determined in any desired manner, depending on the properties of the compounds to be used and the temperature of the liquids to be mixed.

Preferably, the first constituent element contains an oxidizing agent, and the second constituent element contains an oxidized-metal etchant, a protective film-forming agent, and a dissolution promoter for the protective film-forming agent. If desired, the first constituent element may contain a protective film-forming agent and a dissolution promoter for the agent. Also if desired, the first and second constituent elements may independently contain any other ingredients.

It is desirable that the oxidizing agent is not heated at a temperature higher than 40° C., since the decomposition of the agent is promoted at such a high temperature. Therefore, in the mixing step, it is desirable that the oxidizing agent and a mixture containing it (for example, the first constituent element, as well a mixture of the first and second constituent elements, and also their dilutions) are kept at a temperature at highest 40° C.

Preferably, at least a part of the protective film-forming agent is in the form of solid particles having a mean particle size of at most 100 μm, and the agent of this type is dissolved or dispersed in the metal-polishing liquid. Unless otherwise specifically indicated, the mean particle size referred to herein indicates a number-average particle size of particles.

The invention further provides a polishing method using the metal-polishing liquid of the invention. Specifically, the polishing method which the invention provides comprises applying the metal-polishing liquid of the invention to a polishing pad set on a platen, and while keeping the surface of an article to be polished in contact with the polishing pad, moving the polishing pad and the surface of the article relatively to each other to thereby polish the surface of the article.

The polishing method of the invention may further comprises a step of mixing the first and second constituent elements and a diluent in any desired order to prepare the metal-polishing liquid, prior to the polishing step.

Different from conventional polishing liquids, the metal-polishing liquid of the invention is readily prepared from the metal-polishing liquid material having a high concentration by diluting the material, and therefore its advantages are that the costs for producing the metal-polishing liquid can be reduced, the capacity of the tanks for transporting the liquid can be reduced, and the capacity of the tanks for storing, transporting and using it in polishing plants can be reduced.

To the metal-polishing liquid, added is a dissolution promoter which is for essentially increasing the solubility in water of the protective film-forming agent. Accordingly, the material for the metal-polishing liquid may have a broader and higher concentration, in accordance with the polishing capabilities of the liquid.

A. Constituent Ingredients:

The constituent ingredients of the metal-polishing liquid material and the metal-polishing liquid of the invention are described hereinunder.

(1) Dissolution Promoter;

The dissolution promoter for use in the invention is preferably a solvent in which the solubility of the protective film-forming agent is at least 25 g/liter, or a surfactant. These may be used either singly or as combined.

a. Surfactant:

A surfactant, if added to the metal-polishing liquid material or the metal-polishing liquid of the invention, increases the solubility in water of the protective film-forming agent, since the hydrophobic groups in the protective film-forming agent adsorb the surfactant and the hydrophilic groups in the thus-adsorbed surfactant act to increase the miscibility of the agent with water.

The surfactant includes, for example, esters, ethers, polysaccharides, salts of amino acids, polycarboxylic acids, salts of polycarboxylic acids, vinyl polymers, sulfonic acids, salts of sulfonic acids, and amides. One or more of these may be used either singly or as combined.

The surfactant is grouped into anionic surfactants, cationic surfactants, ampholytic surfactants and nonionic surfactants. Preferred examples of the surfactants of all those groups for use herein are mentioned below.

The anionic surfactants include salts of carboxylic acids, salts of sulfonic acids, salts of sulfate esters, and salts of phosphoric esters.

The salts of carboxylic acids include soap, salts of N-acylamino acids, polyoxyethylene alkyl ether-carboxylates, polyoxypropylene alkyl ether-carboxylates, acylated peptides, etc.

The salts of sulfonic acids include alkylsulfonates, alkylbenzenesulfonates, alkynaphthalenesulfonates, naphthalenesulfonates, sulfosuccinates, α-olefin-sulfonates, N-acylsulfonates, etc.

The salts of sulfate esters include sulfated oils, salts of alkylsulfates, salts of alkylether-sulfates, salts of polyoxyethylene allyl ether-sulfates, salts of polyoxypropylene alkylallyl ether-sulfates, salts of alkylamidosulfates, etc.

The salts of phosphoric esters include salts of alkylphosphates, salts of polyoxyethylene alkylallyl ether phosphates, salts of polyoxypropylene alkylallyl ether phosphates, etc.

The cationic surfactants Include aliphatic amine salts, aliphatic quaternary ammonium salts, chlorobenzalkonium salts chlorobenzetonium, pyridinium salts, imidazolinium salts, etc.

The ampholytic surfactants include carboxybetaine-type surfactants, salts of aminocarboxylic acids, imidazolinium betaine, lecithin, alkylamine oxides, etc.

The nonionic surfactants include ether-type, ether-ester-type, ester-type, and nitrogen-containing surfactants, etc. Fluorine-containing surfactants are also preferred for use herein.

The ether-type surfactants include polyoxyethylene alkyl ethers, polyoxyethylene alkylphenyl ethers, alkylallylform-aldehyde-condensed polyoxyethylene ethers, polyoxyethylene-polyoxypropylene block polymers, polyoxyethylene-polyoxypropylene alkyl ethers, etc.

The ether-ester-type surfactants include glycerin ester-polyoxyethylene ethers, sorbitan ester-polyoxyethylene ethers, sorbitol ester-polyoxyethylene ethers, etc.

The ester-type surfactants include polyethylene glycol-fatty acid esters, glycerin esters, polyglycerin esters, sorbitan esters, propylene glycol esters, sucrose esters, etc.

The nitrogen-containing surfactants include fatty acid alkanolamides, polyoxyethylene-fatty acid amides, polyoxyethylene-alkylamides, etc.

In addition, the following surfactants are also preferred for use herein:

esters such as glycerin esters, sorbitan esters, methoxyacetate, ethoxyacetate and 3-ethoxypropionate, alanine ethyl ester, etc.;

ethers such as polyethylene glycols, polypropylene glycols, polytetramethylene glycols, polyethylene glycol alkyl ethers, polyethylene glycol alkenyl ethers, alkylpolyethylene glycols, alkylpolyethylene glycol alkyl ethers, alkylpolyethylene glycol alkenyl ethers, alkenylpolyethylene glycols, alkenylpolyethylene glycol alkyl ethers, alkenylpolyethylene glycol alkenyl ethers, polypropylene glycol alkyl ethers, polypropylene glycol alkenyl ethers, alkylpolypropylene glycols, alkylpolypropylene glycol alkyl ethers, alkylpolypropylene glycol alkenyl ethers, alkenylpolypropylene glycols, alkenylpolypropylene glycol alkyl ethers, alkenylpolypropylene glycol alkenyl ethers, etc.;

sulfonic acids such as methyltauric acid, methyl sulfate, butyl sulfate, vinylsulfonic acid, 1-allylsulfonic acid, 2-allylsulfonic acid, methoxymethylsulfonic acid, ethoxymethylsulfonic acid, 3-ethoxypropylsulfonic acid, etc.;

salts of sulfonic acids such as ammonium methyltaurate, sodium methyltaurate, sodium methylsulfate, ammonium ethylsulfate, ammonium butylsulfate, sodium vinylsulfonate, sodium 1-allylsulfonate, sodium 2-allylsulfonate, sodium methoxymethylsulfonate, ammonium ethoxymethylsulfonate, sodium 3-ethoxypropylsulfonate, sodium sulfosuccinate, etc.; and amides such as propionamide, acrylamide, methylurea, nicotinamide, succinamide, sulfanylamide, etc.

In a case where articles to be polished by the polishing liquid of the invention are silicon substrates for LSI, it is undesirable to contaminate them with alkali metals, alkaline earth metals and halides, therefore, acids or their ammonium salts are preferred. However, in a case where articles to be polished are glass substrates and the like, no limitation is needed for them.

The amount of the surfactant in the metal-polishing liquid (this is ready for use, prepared from a material for it by optionally adding any desired additives thereto and by diluting it with a diluent) preferably falls between 0.01 g and 3 g relative to 100 g of the total of the oxidizing agent, the oxidized-metal etchant, the protective film-forming agent, the surfactant and water. More preferably, it fails between 0.03 g and 1 g, particularly preferably between 0.1 g and 0.8 g. If its amount is smaller than 0.01 g, the surfactant added will be ineffective; but if larger than 3 g, too much surfactant will lower the rate of CMP.

b. Solvent:

To the polishing liquid material of the invention, added is a solvent in which the solubility of the protective film-forming agent existing in the material is at least 25 g/liter in order to increase the solubility in water of the protective film-forming agent. Preferably, the solubility in the solvent of the protective film-forming agent is at least 40 g/liter, more preferably at least 50 g/liter. To that effect, especially preferred are good solvents for the protective film-forming agent.

Preferred examples of the solvent serving as the dissolution promoter for the protective film-forming agent in the invention are organic solvents such as alcohols, ethers, ketones, etc. These solvents may be used either singly or as a combination of any two kinds thereof or more.

Preferred solvents for the dissolution promoter for use in the invention are mentioned below.

Alcohols such as methanol, ethanol, 1-propanol, 2-propanol, 2-propyn-1-ol, allyl alcohol, ethylene cyanohydrin, 1-butanol, 2-butanol, (S)-(+)-2-butanol, 2-methyl-1-propanol, t-butyl alcohol, perfluoro-t-butyl alcohol, t-pentyl alcohol, 1,2-ethanediol, 1,2-propanediol, 1,3-propanediol, 1,3-butanediol, 2,3-butanediol, 1,5-pentanediol, 2-butene-1,4-diol, 2-methyl-2,4-pentanediol, glycerin, 2-ethyl-2-(hydroxymethyl)-1,3-propanediol, 1,2,6-hexanetriol, etc.;

Ethers such as dioxane, trioxan, tetrahydrofuran, diethylene glycol diethyl ether, 2-methoxyethanol, 2-ethoxyethanol, 2,2-(dimethoxy)ethlanol, 2-isopropoxyethanol, 2-butoxyethanol, 1-methoxy-2-propanol, 1-ethoxy-2-propanol, furfuryl alcohol, tetrahydrofurfuryl alcohol, ethylene glycol, diethylene glycol, diethylene glycol monomethyl ether, diethylene glycol monoethyl ether, diethylene glycol monobutyl ether, triethylene glycol, triethylene glycol monomethyl ether, tetraethylene glycol, dipropylene glycol, dipropylene glycol monomethyl ether, dipropylene glycol monoethyl ether, tripropylene glycol monomethyl ether, diacetone alcohol, 2-methoxyethyl acetate, 2-ethoxyethyl acetate, diethylene glycol monoethyl ether acetate, etc.;

Ketones such as acetone, methyl ethyl ketone, acetylacetone, cyclohexanone, etc.

Of those solvents, more preferred are methanol, ethanol, 2-propanol, tetrahydrofuran, ethylene glycol, acetone, and methyl ethyl ketone.

The amount of the solvent added to the polishing liquid material is not specifically defined, but is preferably smaller than 50 g relative to 100 g of the total amount of the material. More preferably, it is smaller than 25 g. If the amount of the solvent is 50 g or more, there is the possibility that the rate of CMP is lowered because the interface to be polished is in a state different from that in the case of a water-based solvent system.

(2) Protective Film-Forming Agent:

The protective film-forming agent is to form a protective film on the surface of the metal. It includes, for example, nitrogen-containing compounds such as ammonia, alkylamines, amino acids, imines and azoles, and their salts; sulfur-containing compounds such as mercaptans; and water-soluble polymers such as polysaccharides, polycarboxylic acids, salts of polycarboxylic acids, vinyl polymers, etc. These may be used either singly or as a combination of two kinds thereof or more.

Preferred examples of the protective film-forming agent for use in the invention are mentioned below:

ammonia;

amines, for example, alkylamines such as dimethylamine, trimethylamine, triethylamine, propylenediamine, etc.; ethylenediaminetetraacetic acid (EDTA), sodium diethyldithiocarbamate, chitosan, etc.;

amino acids such as glycine, L-alanine, β-alanine, L-2-aminobutyric acid, L-norvaline, L-valine, L-leucine, L-norleucine, L-isoleucine, L-alloisoleucine, L-phenylalanine, L-proline, sarcosine, L-ornithine, L-lysine, taurine, L-serine, L-threonine, L-allothreonine, L-homoserine, L-tyrosine, 3,5-diiodo-L-tyrosine, β(3,4-dihydroxyphenyl)-L-alanine, L-thyroxine, 4-hydroxy-L-proline, L-cysteine, L-methionine, L-ethionine, L-lanthionine, L-cystathionine, L-cystine, L-cysteic acid, L-aspartic acid, L-glutamic acid, S-(carboxymethyl)-L-cysteine, 4-aminobutyric acid, L-asparagine, L-glutamine, azaserine, L-arginine, L-canavanine, L-citrulline, δ-hydroxy-L-lysine, creatine, L-kynurenine, L-histidine, 1-methyl-L-histidine, 3-methyl-L-histidine, ergothioneine, L-tryptophan, actinomycin C1, apamine, angiotensin I, angiotensin II, antipine, etc.;

imines such as dithizone, cuproin (2,2'-biquinoline), neocuproin (2,9-dimethyl-1,10-phenanthroline), vasocuproin (2,9-dimethyl-4,7-diphenyl-1,10-phenanthroline), cuperazone (biscyclohexanone-oxalylhydrazone), etc.;

azoles such as benzimidazole-2-thiol, 2-[2-(benzothiazolyl)]thiopropionic acid, 2-[2-(benzothiazolyl)]thiobutyric acid; 2-mercaptobenzothiazole, 1,2,3-triazole, 1,2,4-triazole, 3-amino-1H-1,2,4-triazole, benzotriazole, 1-hydroxybenzotriazole, 1-dihydroxypropylbenzotriazole, 2,3-dicarboxypropylbenzotriazole, 4-hydroxybenzotriazole, 4-carboxyl-1H-benzotriazole, 4-methoxycarbonyl-1H-benzotriazole, 4-butoxycarbonyl-1H-benzotriazole, 4-octyloxycarbonyl-1H-benzotriazole, 5-hexylbenzotriazole, N-(1,2,3-benzotriazolyl-1-methyl)-N-(1,2,4-triazolyl-1-methyl)-2-ethylhexylamine, tolyltriazole, naphthotriazole, bis[(1-benzotriazolyl)methyl]phosphonic acid, etc.;

mercaptans such as nonylmercaptan, dodecylmercaptan, triazinethiol, triazinedithiol, triazinetrithiol, etc.;

polysaccharides such as alginic acid, pectic acid, carboxymethyl cellulose, curdlane, pullulane, etc.;

salts of amino acids such as glycine ammonium salt, glycine sodium salt, etc.;

polycarboxylic acids and their salts, such as polyaspartic acid, polyglutamic acid, polylysine, polymalic acid, polymethacrylic acid, ammonium polymethacrylate, sodium polymethacrylate, polyamidic acid, polymaleic acid, polyitaconic acid, polyfumaric acid, poly(p-styrenecarboxylic acid), polyacrylic acid, polyacrylamide, aminopolyacrylamide, ammonium polyacrylate, sodium polyacrylate, ammonium polyamidate, sodium polyamidate, polyglyoxylic acid, etc.; and vinyl polymers such as polyvinyl alcohol, polyvinylpyrrolidone, polyacrolein, etc.

Of those protective film-forming agents, preferred are chitosan, ethylenediaminetetraacetic acid, L-tryptophan, cuperazone, triazinedithiol, benzotriazole, 4-hydroxybenzotriazole, 4-carboxy-1H-benzotriazole butyl ester, tolyltriazole, naphthotriazole, polymalic acid, polyacrylic acid, polyacrylamide, ammonium polyacrylate, and polyvinyl alcohol, as they satisfy the two requirements of high CMP rate and low etching rate.

The amount of the protective film-forming agent to be added to the metal-polishing liquid preferably falls between 0.0001 mol and 0.05 mol, more preferably between 0.0003 mol and 0.005 mol, particularly preferably between 0.0005 mol and 0.0035 mol, relative to 100 g of the total amount of the oxidizing agent, the oxidized-metal etchant, the protective film-forming agent, the dissolution promoter and water that constitute the liquid. If its amount is smaller than 0.0001 mol, the protective film-forming agent will be ineffective for etching retardation; but if larger than 0.05 mol, the rate of CMP will be lowered.

Preferably, the amount of the protective film-forming agent, of which the solubility In water at room temperature is lower than 5% by weight, to be used in preparing the metal-polishing liquid material is not larger than 2 times the solubility of the agent in water at room temperature, more preferably not larger than 1.5 times. Concretely, in general, the amount of the protective film-forming agent preferably falls between 0.0001 mol and 0.05 mol, preferably between 0.0003 mol and 0.05 mol, more preferably between 0.0005 mol and 0.0035 mol, relative to 100 g of the metal-polishing liquid material. If the amount of the protective film-forming agent therein is larger than 2 times the solubility in water of the agent, the concentrated liquid material-could not be prevented from forming a deposit of the agent when cooled at 5° C.

In a case where the protective film-forming agent to be used in preparing the metal-polishing liquid material of the invention is solid, it is desirable that the solid agent has a mean particle size of at most 100 μm and is dissolved or dispersed in the metal-polishing liquid material. Concretely, when the liquid material is composed of at least two constituent elements not mixed as yet (each element may be a single substance or a composition of substances), the solid agent may be dissolved or dispersed in at least one constituent element. The solid, protective film-forming agent having such a small particle size can be prepared, for example, by grinding the solid agent. Using the solid, protective film-forming agent having such a small particle size is desirable, as the surface area of the agent is large and therefore the dissolution rate of the agent is high. In addition, even if fine particles of the solid agent are dispersed in the liquid material, not dissolved therein, they may be readily dissolved therein within a short period of time when they are mixed with the other ingredients and/or a diluent. Therefore, the mean particle size of the solid agent is preferably at most 50 μm, more preferably at most 20 μm.

(3) Oxidizing Agent:

The oxidizing agent to be used in the invention is a compound capable of oxidizing metals. Preferred examples of the oxidizing agent for use herein are hydrogen peroxide, nitric acid, potassium periodate, hypochlorous acid, ozonized water, etc. Of those oxidizing agents, especially preferred is hydrogen peroxide ($H_2O_2$). In case where the articles to be polished are silicon substrates with semiconductor chips mounted thereon, it is undesirable to contaminate the articles with alkali metals, alkaline earth metals and halides, therefore, preferred are oxidizing agents not containing a non-volatile component. However, since ozonized water is unstable due to its greatly varying with time, most preferred is hydrogen peroxide In a case where articles to be polished are glass substrates with no semiconductor chips thereon, the oxidizing agent may contain a non-volatile component.

The amount of the oxidizing agent to be in the metal-polishing liquid of the invention preferably falls between 0.003 mol and 0.7 mol, more preferably between 0.03 mol and 0.5 mol, particularly preferably between 0.2 mol and 0.3 mol, relative to 100 g of the total amount of the oxidizing agent, the oxidized-metal etchant, the protective film-forming agent, the dissolution promoter and water. If the amount of the oxidizing agent is smaller than 0.003 mol, metal oxidation with it will be unsatisfactory and the rate of CMP will be lowered; but if larger than 0.7 mol, too much oxidizing agent will roughen the surface of the article. The amount of the oxidizing agent to be in the metal-polishing liquid material generally falls between 0.03 and 0.7 mol relative to 100 g of the material, but preferably falls between 0.3 mol and 0.5 mol, more preferably between 0.2 mol and 0.3 mol relative to 100 g of the material.

(4) Oxidized-Metal Etchant;

For the oxidized-metal etchant, preferred is a water-soluble compound. Its preferred examples are organic acids, sulfuric acid and their ammonium salts. These compounds may be used either singly or as a combination of two kinds thereof or more. When used in preparing the polishing liquid or the polishing liquid material, the compound may be added in the form of its aqueous solution.

Specific examples of the oxidized-metal etchant are mentioned below:

organic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, etc.;

inorganic acids such as sulfuric acid, nitric acid, chromic acid, etc.;

ammonia; and salts such as ammonium salts of the above-mentioned organic or inorganic acids (e.g., ammonium persulfate, ammonium nitrate, ammonium chloride), etc.

These may be used either singly or as a combination of two kinds thereof or more.

Of the compounds, formic acid, malonic acid, malic acid, tartaric acid and citric acid are favorable to films of copper, copper alloys, copper oxides or copper alloy oxides (and also to laminate films containing at least one of these metal layers). In particular, malic acid, tartaric acid and citric acid are preferred, as they ensure a practicable rate of CMP and can effectively control the etching rate.

The amount of the oxidized-metal etchant to be in the metal-polishing liquid of the invention preferably falls between 0.000001 mol and 0.005 mol, more preferably between 0.00005 mol and 0.0025 mol, particularly preferably between 0.0005 mol and 0.0015 mol, per 100 g of the total amount of the oxidizing agent, the oxidized-metal etchant, the protective film-forming agent, the dissolution promoter and water. If the amount of the etchant is larger than 0.005 mol, control of the etching tends to be difficult. The amount of the oxidized-metal etchant to be in the metal-polishing liquid material of the invention may fall generally between $1 \times 10^{-6}$ mol and 0.005 mol, but preferably between $5 \times 10^{-5}$ mol and 0.0025 mol, more preferably between 0.0005 mol and 0.0015 mol, relative to 100 g of the metal-polishing liquid material, (5) Abrasive Grains:

The metal-polishing liquid of the invention may not substantially contain solid abrasive grains, but may contain them.

In a case where abrasive grains are used, the order of mixing and also the ingredients with which the abrasive grains are mixed are not specifically defined. When the metal-polishing liquid material is composed of at least two constituent elements not mixed as yet (each element may be a single substance or a composition of substances), abrasive grains may be in any constituent element (that may be a single substance or a composition of substances), or may be in two or more such constituent elements.

The abrasive grains may be any of, for example;

inorganic abrasive grains of silica, alumina, ceria, titania, zirconia, germania, silicon carbide, etc.; and organic abrasive grains of polystyrene, polyacrylates, polyvinyl chloride, etc.

Preferred for use herein are colloidal silica and colloidal alumina having a mean particle size of at most 100 nm, since their dispersion stability in the polishing liquid is good and since they form few scratches in CMP with the liquid. More preferably, the mean particle size of the abrasive grains is at most 20 nm, since such small abrasive grains are effective for more rapidly polishing barrier layers, and for polishing silicon dioxide at a lower rate.

For colloidal silica, known is a method of producing it through hydrolysis of silicon alkoxides or through ion-exchange of sodium silicate. For colloidal alumina, also known is a method of producing it through hydrolysis of aluminium nitrate.

The amount of the abrasive grains to be in the metal-polishing liquid (this is ready for use, prepared from a material for it by optionally adding any desired additives thereto and by diluting it with a diluent) preferably falls between 0.01 and 10% by weight of the total amount of the liquid, more preferably between 0.05 and 5% by weight thereof. If their amount is smaller than 0.01% by weight, the abrasive grains added will be ineffective; but even if larger than 10% by weight, the rate of CMP will be saturated and will be no more increased. The amount of the abrasive grains to be in the metal-polishing liquid material of the invention preferably falls between 0.01 and 10% by weight, more preferably between 0.05 and 5% by weight of the total amount of the polishing liquid material.

(6) Water:

The metal-polishing liquid material of the invention may contain water. The amount of water in the material may be suitably determined, depending on the other constituent ingredients and their solubility in water. In general, the water content of the material may fall between 50 and 98% by weight, preferably between 70 and 90% by weight. In a case where some constituent ingredients of the material contain water, for example, when the oxidizing agent in the material is aqueous hydrogen peroxide, the amount of water to be in the metal-polishing liquid material that contains such a water-containing ingredient is more preferably from 75 to 85% by weight. On the other hand, the amount of water to be in the metal-polishing liquid material not containing such a water-containing ingredient is more preferably from 80 to 90% by weight.

B. Method of Producing Metal-Polishing Liquid:

The metal-polishing liquid of the invention is prepared by diluting the metal-polishing liquid material of the invention, with a diluent. The concentration of each constituent ingredient in the metal-polishing liquid material (that is, the compositional ratio) shall be determined, depending on the composition and the amount of the diluent to be used for diluting the material and on the concentration of each constituent ingredient of the metal-polishing liquid to be prepared (that is, the compositional ratio).

In a case where water is used for the diluent, the metal-polishing liquid material is so prepared that its composition and compositional ratio of the constituent ingredients except water are the same as those of the metal-polishing liquid; or that is, the water content of the material is reduced to have an Increased concentration. In that condition, when water is added to the material to dilute it, then a metal-polishing liquid having a desired composition can be prepared.

On the other hand, in a case where an aqueous solution is used for the diluent, it is preferred that an aqueous solution containing at least one of an oxidizing agent, an oxidized-metal etchant, a protective film-forming agent and a dissolution promoter for the protective film-forming agent is used. In this case, a metal-polishing liquid material that contains at least one ingredient of the group consisting of an oxidizing agent, an oxidized-metal etchant, a protective film-forming agent and a dissolution promoter for the protective film-forming agent is diluted with an aqueous diluent solution of at least one ingredient of that ingredient group to prepare the metal-polishing liquid of the invention. To this, any other desired Ingredients may be added at the dilution.

In that case of using such an aqueous diluent solution, the concentration of each ingredient of the metal-polishing liquid material shall be so determined that the material can form, after the metal-polishing liquid material and the aqueous diluent solution (and additives to be added as required) have been mixed, a metal-polishing liquid having a desired composition and a desired concentration. Accordingly in the case, hardly-soluble ingredients can be incorporated with the metal-polishing liquid material in a form of an aqueous solution, and therefore the concentration of the material for metal-polishing liquid can be more increased. For that purpose, it is desirable that the aqueous solution contains a protective film-forming agent of low solubility and a dissolution promoter for the agent.

In a case where the metal-polishing liquid material is composed of at least two constituent elements not mixed as yet (each element may be a single substance or a composition of substances), the order of mixing the constituent elements with a diluent is not specifically defined, and it may be determined in any desired manner depending on the solubility of each constituent ingredient and on the temperature at which they are dissolved. For example, one or more constituent elements are mixed with a diluent added thereto and thereafter with the other constituent elements; or the constituent elements are first mixed and then with a diluent added thereto; or a diluent is first added to and mixed with each constituent element and thereafter the resulting constituent elements are mixed. Any of such methods may be employed for mixing the constituent elements with a diluent.

Concretely, for example, when used is the metal-polishing liquid material composed of a first constituent element A of an oxidizing agent and a second constituent element B that comprises an oxidized-metal etchant, a protective film-forming agent, a dissolution promoter and water, any of the following methods (1) to (5) may be selected and employed for preparing a metal-polishing liquid (or that is, for diluting the metal-polishing liquid material).

(1) A method of mixing the constituent element A and the constituent element B followed by diluting the resulting mixture with a diluent.

(2) A method of diluting the constituent element A with a diluent followed by mixing it with the constituent element B.

(3) A method of diluting the constituent element B with a diluent followed by mixing it with the constituent element A.

(4) A method of diluting the constituent element A and the constituent element B separately with a diluent followed by mixing the diluted constituent element A and the diluted constituent element B.

(5) A method of mixing the constituent element A, the constituent element B and a diluent almost at the same time.

An ingredient of low solubility such as a protective film-forming agent may be divided into two or more portions to be separately in different constituent elements. If so, there is a case where the ingredient may be well dissolved in each constituent element, not requiring an increased amount of the solvent (generally, water) for it.

For example, in a case where a protective film-forming agent is divided into two portions to be separately in two constituent elements, the metal-polishing liquid material may be composed of a first constituent element A that comprises an oxidizing agent, one portion of the protective film-forming agent and a dissolution promoter, arid a second constituent element B that comprises an oxidized-metal etchant, the other portion of the protective film-forming agent, a dissolution promoter and water.

In a case where a protective film-forming agent is divided into three portions to be separately in three constituent elements, the metal-polishing liquid material may be composed of, for example, a first constituent element A that comprises an oxidizing agent and a part of the protective film-forming agent, a second constituent element B that comprises an oxidized-metal etchant and another part of the protect film-forming agent, and a third constituent element C that comprises the remaining part of the protective film-forming agent and a dissolution promoter.

In such cases of dividing a metal-polishing liquid material into a plurality of constituent elements each containing a portion of one and the same ingredient, a large amount of a protective film-forming agent of low solubility can be dissolved in a solvent (generally, water) and therefore the concentration of the metal-polishing liquid material can be increased. The number of the constituent elements into which the ingredients of a metal-polishing liquid material are divided is not limited to 2 or 3 as in the embodiments mentioned above, and may be determined in any desired manner.

The invention is not limited to the embodiments mentioned above, and may apply to any and every method of preparing a metal-polishing liquid material of high concentration that comprises a plurality of constituent elements followed by diluting the material into a desired metal-polishing liquid.

In the metal-polishing liquid of the invention, hydrogen peroxide suitable for the oxidizing agent decomposes at temperatures higher than 40° C. Therefore, if the liquid containing hydrogen peroxide is stored or used at temperatures higher than 40° C., the concentration of the oxidizing agent, hydrogen peroxide will vary and have some negative influences on the polishing speed. Therefore, it is desirable that the oxidizing agent and a mixture containing it are kept at a temperature not higher than 40° C.

However, the solubility of compounds generally increases at higher liquid temperatures. Therefore, it is desirable that solutions of compounds of low solubility are kept at higher temperatures for ensuring higher solubility of the compounds therein.

Accordingly in the method of producing the metal-polishing liquid of the invention, it is desirable that the first constituent element containing an oxidizing agent is kept at a temperature not higher than 40° C. while the other constituent elements are kept at temperatures falling between room temperature and 100° C., and that, when the first constituent element is mixed with the other constituent elements or with a diluent, it is desired that the resulting liquid mixture is kept at a temperature not higher than 40° C.

In a case where a compound of low solubility is dissolved under heat, the dissolved compound will be partly deposited in the solution when the temperature of the solution is lowered. In such a case, the solution is again heated so as to dissolve the compound therein before use.

C. Polishing Method:

Next described is the polishing method of the invention.

The polishing method of the invention comprises polishing a metal film with the metal-polishing liquid of the invention to thereby remove at least a part of the metal film. The polishing method of the invention is especially favorable to polishing a metal laminate film containing a metal layer of at least one selected from copper, copper alloys, copper oxides and copper alloy oxides (hereinafter these are referred to simply as copper alloys).

When the surface of a substrate, which has a desired groove pattern thereon and which is coated with a metal film containing any of copper and copper alloys (copper/chromium, etc.) to fill the patterned grooves on its surface, is polished in a mode of CMP with the metal-polishing liquid of the invention, the metal film in the hilled area of the substrate is selectively removed through CMP while the metal film in the grooved area thereof is left as it is, and, as a result, a desired conductor pattern is formed on the substrate.

The present inventors have found that, when the etching rate in the polishing step is controlled to be at most 10 nm/min, it produces a good result of planarization. As far as the CMP rate depression that results from the etching rate depression is within an acceptable range, the etching, rate is preferably lower. For example, when the etching rate is controlled to be at most 5 nm/min, dishing will be negligible even in a case of about 50% excess CMP (this means that the actual working time of CMP is about 1.5 times the time necessary for removing the intended metal film through CMP). Further, the etching rate, if controlled to be not higher than 1 nm/min, causes no problem of dishing even in 100% or more excess CMP.

The etching rate referred to herein is meant to indicate the rate of etching a metal film formed on a substrate when the substrate (this has a grooved pattern on its surface and is coated with a metal film to fill the grooves) is dipped in a metal-polishing liquid and the liquid is stirred at room temperature (25° C.) at 100 rpm. The difference in the thickness of the metal film, before and after the treatment, is obtained in terms of the electric resistance value of the metal film, and the etching rate is derived from the thickness difference.

The polishing method using the metal-polishing liquid of the invention comprises applying the metal-polishing liquid of the invention to a polishing pad set on a platen, while keeping the surface of an article to be polished in contact with the polishing pad, moving the polishing pad and the surface of the article relatively to each other to thereby polish the surface of the article.

Any ordinary polishing device is usable in the method of the invention. One example of the polishing device usable herein comprises a holder for a semiconductor substrate or the like having a surface to be polished, and a platen with a polishing pad stuck thereon (this is equipped with a revolution-variable motor or the like). The polishing pad is not specifically defined, and any of nonwoven fabrics, polyurethane foams, porous fluorine resins and the like is usable.

The polishing condition is not also specifically defined. Preferably, however, the rotation speed of the platen is not so high, at most 200 rpm, so that the substrate being polished is not off the polishing pad. The pressure under which the article (semiconductor substrate, etc.) to be polished (having a film to be polished) is to be pressed against the polishing pad preferably falls between 9.8 KPa and 98.1 KPa (between 100 and 1000 gf/cm$^2$), more preferably between 9.8 KPa and 49.0 KPa (between 100 and 500 gf/cm$^2$) for satisfying both the wafer in-plane uniformity of the polishing rate and the pattern planarization.

While polishing, a metal-polishing liquid is continuously fed to the polishing pad via a pump or the like. The amount of the polishing liquid to be fed thereto is not specifically defined, but is preferably such that the surface of the polishing pad is all the time covered with the polishing liquid.

After the completion of polishing, it is desirable that the semiconductor substrate is well washed with running water, then the water drops still remaining on the semiconductor substrate are removed by the use of a spin drier or the like, and thereafter the semiconductor substrate is dried.

In the polishing method of the invention, the metal-polishing liquid of the invention may be previously prepared and put in a tank (polishing liquid tank) in a polishing apparatus, or the metal-polishing liquid may be prepared in the tank, and the liquid may be fed to a polishing pad; or the metal-polishing liquid material of the invention and a diluent may be separately fed to a polishing apparatus, and mixed in the apparatus (including the pipe line therein). In the latter case, the polishing liquid is prepared in the polishing apparatus while fed to a polishing pad. In any case, the above-mentioned method of producing the metal-polishing liquid of the invention applies to the preparation of the metal-polishing liquid.

For the method of preparing the metal-polishing liquid from its material in a polishing apparatus, for example, employed is a method that a pipe line for the metal-polishing liquid material and a pipe line for a diluent meet to form one pipe line in which the two liquids from the two pipe lines are mixed and a diluted, metal-polishing liquid. The polishing liquid thus prepared is fed to a polishing pad.

For mixing, employable is any ordinary method, For example, the liquids to be mixed are introduced under pressure into a narrow pipe line so that they, collide with each other to be mixed; or the pipe line for the liquids to be mixed therein is filled with a filler such as glass tubes or the like so that the liquid flows therein are repeatedly divided, separated and merged; or some power-driven blades are disposed in a pipe line.

For preparing the metal-polishing liquid in a pipe line, also employable is a method that a pipe line for the material for the metal-polishing liquid and a pipe line for a diluent are independently provided, and the predetermined amount of the resultant two liquids from the two independent pipe lines are separately fed to a polishing pad on which they are mixed owing to the relative motion of the polishing pad to the surface of the article to be polished.

In a case where the metal-polishing liquid material is composed of a plurality of constituent elements, different pipe lines may be provided for every constituent element to prepare the metal-polishing liquid in the same manner as the above-mentioned methods.

In the polishing method of the invention, the constituent element containing an oxidizing agent of the metal-polishing liquid material may be kept at a temperature not higher than 40° C. while the other constituent elements are kept at a temperature falling between room temperature and 100° C., and, after all these constituent elements have been mixed together, the resulting mixture may be kept at a temperature not higher than 40° C. Accordingly, the method is favorable for increasing the solubility of poorly-soluble constituent elements of the metal-polishing liquid of the invention, since the solubility of the ingredients increases at higher temperatures.

The constituent elements prepared by dissolving the ingredients (except the oxidizing agent) at elevated temperatures falling between room temperature and 100° C. will deposit in their solutions when the temperature of the solutions is lowered. Therefore, when cooled constituent elements are used, they must previously be warmed in order to dissolve the deposit therein. To deal with this problem, a means for sending a liquid containing a warmed and dissolved constituent element (mixture solution) through a pipe line and a means for sending a deposit-containing liquid under stirring through a pipe line and for warming the pipe line to dissolve the deposit therein may be provided.

When warmed constituent elements are mixed and if the temperature of the constituent element that contains an oxidizing agent is higher than 40° C., the oxidizing agent will decompose. Therefore, it is desirable that the temperature of the constituent element to be warmed, the temperature of the oxidizing agent-containing constituent element to be cooled, and the blend ratio of the two elements are so determined that the temperature of the mixture prepared by mixing the two elements is not higher than 40° C.

BEST MODES OF CARRYING OUT THE INVENTION

The invention is described concretely with reference to the following Examples, which, however, are not intended to restrict the scope of the invention. The polishing condition and others employed in the Examples are mentioned below.

<<Polishing Condition>>

With a metal-polishing liquid being fed to a polishing pad fitted to a platen in a polishing apparatus, via a metering pump, both the polishing pad and a substrate to be polished are rotated relatively to each other, and the substrate is polished with the polishing pad under the condition mentioned below. Unless otherwise specifically indicated, the polishing liquid is previously prepared and stored in one tank (polishing liquid tank), and this is introduced into the metering pump.

Substrate: silicone substrate coated with a 1 μm-thick copper film.

Polishing pad: IC1000 (trade name by Rodel).

Polishing pressure: 20.6 KPa (210 g/cm$^2$).

Relative speed of substrate to platen: 36 m/min.

<<Matters Tested of Polished Samples>>

CMP rate: Before and after CMP, the difference in the copper film thickness is obtained in terms of the electric resistance value of the film.

Etching rate: Before and after dipped in a metal-polishing liquid stirred at 25° C. at 100 rpm, the difference in the copper film thickness is obtained in terms of the electric resistance value of the film.

In order to evaluate the actual CMP characteristics, grooves having a depth of 0.5 μm are formed in an insulating layer, a copper film is formed according to a known sputtering process, and this is buried through known heat treatment. By the use of this silicon substrate with the buried copper layer thereon, CMP is carried out. This is for evaluating the actual CMP characteristics of the substrate. After CMP, the substrate is checked with the naked eye and microscopically with an optical microscope and an electronic microscope for the presence or absence of erosion and scratches.

<<Change with Time>>

Immediately after its preparation, a metal-polishing liquid material is formulated into a metal-polishing liquid. On the other hand, 20 days after its preparation, the same metal-polishing liquid material is formulated into a metal-polishing liquid. The two metal-polishing liquids are subjected to the CMP under the above-mentioned condition, and the CMP rate and the etching rate are measured to check on whether there is a difference in data of the two cases.

Example 1

(1) Preparation of Metal-Polishing Liquid Material

First, 1.5 parts by weight of DL-malic acid (special-grade chemical) serving as an oxidized-metal etchant was dissolved in 61.5 parts by weight of water added thereto, to prepare a solution A. Next, 2 parts by weight of benzotriazole serving as a protective film-forming agent was dissolved in 5 parts by weight of ethanol serving as a good solvent for the protective film-forming agent to prepare a solution B. Finally, the solution B was added to and mixed with the solution A to prepare a metal-polishing liquid material. This is a 10-fold concentrate of a metal-polishing liquid.

When stored at 0° C., the concentrate did not form a deposit therein.

(2) Preparation of Metal-Polishing Liquid

To 7 parts by weight of the 10-fold concentrate, added was 33.2 parts by weight of aqueous hydrogen peroxide (special-grade chemical, aqueous 30% solution) serving as an oxidizing agent. Then, this was diluted with 63 parts by weight of water serving as a diluent to prepare a metal-polishing liquid.

(3) CMP Test

The resultant metal-polishing liquid was subjected to CMP under the above-mentioned polishing condition. The CMP rate was 129 nm/min and the etching rate was 0.5 nm/min, and these were both good. And, no differences in the CMP rate and also in the etching rate due to change of the metal-polishing liquid material caused by the passage of time were found. Further, neither erosion nor scratches were found.

Example 2

(1) Preparation of Metal-Polishing Liquid Material

First, 1.5 parts by weight of DL-malic acid (special-grade chemical) was dissolved in 61 parts by weight of water added thereto, to prepare a solution A. Next, 2 parts by weight of benzotriazole and 0.5 part by weight of ammonium polyacrylate, both serving as a protective film-forming agent, were dissolved in 5 parts by weight of methanol serving as a good solvent for the protective film-forming agent to prepare a solution B. Finally, the solution B was added to the solution A to prepare a metal-polishing liquid material. This is a 10-fold concentrate of a metal-polishing liquid.

(2) Preparation of Metal-Polishing Liquid 7 parts by weight of the 10-fold concentrate for the metal-polishing liquid was diluted with 63 parts by weight of water serving as a diluent, thereafter, 33.2 parts by weight of aqueous hydrogen peroxide (special-grade chemical, aqueous 30% solution) serving as an oxidizing agent was added thereto, to prepare a metal-polishing liquid.

(3) CMP Test

The resultant metal-polishing liquid was used to carry out CMP under the same condition as in Example 1. The CMP rate was 179 nm/min and the etching rate was 0.5 nm/min, and these were both good. And, no differences in the CMP rate and also in the etching rate due to change of the metal-polishing liquid material caused by the passage of time were found. Further, neither erosion nor scratches were found.

Example 3

(1) Preparation of Metal-Polishing Liquid Material 1.5 parts by weight of DL-malic acid (special-grade chemical) and 0.3 part by weight of polyvinyl alcohol serving as a protective film-forming agent were dissolved in 58.7 parts by weight of water added thereto, to prepare a solution A. Next, 2.5 parts by weight of tolyltriazole serving as a protective film-forming agent was dissolved in 7 parts by weight of acetone to prepare a solution B. Finally, the solution B was added to the solution A to prepare a metal-polishing liquid material. This is a 10-fold concentrate of a metal-polishing liquid.

(2) Preparation of Metal-Polishing Liquid 7 parts by weight of the resultant 10-fold concentrate for the metal-polishing liquid was diluted with 63 parts by weight of water serving as a diluent, thereafter, 33.2 parts by weight of aqueous hydrogen peroxide (special-grade chemical, aqueous 30% solution) serving as an oxidizing agent was further added thereto, to prepare a metal-polishing liquid.

(3) CMP Test

The resultant metal-polishing liquid was used to carry out CMP under the same condition as in Example 1. The CMP rate was 170 nm/min and the etching rate was 0.4 nm/min, and these were both good. And, no differences in the CMP rate and also in the etching rate due to change of the metal-polishing liquid material caused by the passage of time were found. Further, neither erosion nor scratches were found.

Example 4

(1) Preparation of Metal-Polishing Liquid Material 0.06 part by weight of naphthotriazole serving as a protective film-forming agent was dissolved in 0.6 part by weight of methyl ethyl ketone, a good solvent for the protective film-forming agent, to prepare a solution A. 10 parts by weight of potassium periodate serving as an oxidizing agent was dissolved in 20 parts by weight of water to prepare a solution B. Next, the solution B was added to the solution A to prepare a solution C (this is a first constituent element).

On the other hand, 0.05 part by weight of DL-tartaric acid (special-grade chemical) serving as an oxidized-metal etchant was dissolved in 30 parts by weight of water added thereto to prepare a solution D. 0.01 part by weight of naphthotriazole was dissolved in 0.1 part by weight of methyl ethyl ketone to prepare a solution E. Then, the solution E was added to the solution D to prepare a solution F (this is a second constituent element).

Subsequently, 0.1 part by weight of DL-tartaric acid was dissolved in 40 parts by weight of water added thereto to prepare a diluent solution G (this is an aqueous solution serving as a diluent).

The solutions C, F and G thus prepared in the manner as above are the materials to be formulated into a metal-polishing liquid.

(2) Preparation of Metal-Polishing Liquid

The solutions C, F and G prepared in the above were mixed in a ratio by weight of 3/3/4 to prepare a metal-polishing liquid.

(3) CMP Test

The resultant metal-polishing liquid was used to carry out CMP under the same condition as in Example 1. The CMP rate was 126 nm/min and the etching rate was 0.4 nm/min, and these were both good. And, no differences in the CMP rate and also in the etching rate due to change of the metal-polishing liquid material caused by the passage of time were found. Further, neither erosion nor scratches were found.

Example 5

(1) Preparation of Metal-Polishing Liquid Material

To 0.15 part by weight of DL-malic acid (special-grade chemical), added were 0.4 part by weight of polyacrylamide serving as a protective film-forming agent and 50 parts by weight of water, and these were dissolved to prepare a solution A. Next, 0.2 part by weight of benzotriazole was dissolved in 0.7 part by weight of ethylene glycol to prepare a solution B. Finally, to the solution A under heat at 45° C., the solution B was added to it kept at 45° C. to prepare a solution C, which is a material for a metal-polishing liquid. The solution C was kept also at 45° C.

(2) Preparation of Metal-Polishing Liquid

Kept at 45° C., the solution C was diluted with 20 parts by weight of water heated at 45° C., and then 33.2 parts by weight of aqueous hydrogen peroxide (special-grade chemical, aqueous 30% solution) at 20° C. was poured thereinto to prepare a metal-polishing liquid. The temperature of the thus-prepared, metal-polishing liquid was 36° C.

(3) CMP Test

The above-mentioned metal-polishing liquid was used to carry out CMP under the same condition as in Example 1. The CMP rate was 167 nm/min and the etching rate was 0.3 nm/min, and these were both good. And, no differences in the CMP rate and also in the etching rate due to change of the metal-polishing liquid material caused by the passage of time were found. Further, neither erosion nor scratches were found.

Example 6

(1) Preparation of Metal-Polishing Liquid Material

A metal-polishing liquid material was prepared in the same manner as in Example 1. In this, however, benzotriazole was previously ground in a mortar with a pestle for 5 minutes, before it was dissolved. After thus ground, the benzotriazole powder was observed with an optical microscope, and its mean particle size was 80 µm. In this Example, by the use of the benzotriazole having a reduced particle size through this pre-treatment, the time taken to completely dissolve benzotriazole in ethanol was shortened from 5 minutes to 2 minutes.

(2) Preparation of Metal-Polishing Liquid, and CMP Test

By the use of the metal-polishing liquid material prepared in the above, a metal-polishing liquid was formulated in the same manner as in Example 1. This was used to carry out CMP under the same condition as in Example 1. As a result, the CMP rate was 130 nm/min and the etching rate was 0.5 nm/min, and these were both good. And, no differences in the CMP rate and also in the etching rate due to change of the metal-polishing liquid material caused by the passage of time were found. Further, neither erosion nor scratches were found.

Example 7

To the metal-polishing liquid of Example 2, added was 1 part by weight of colloidal silica having a mean particle size of 100 nm and serving as abrasive grains, and this was dispersed therein to prepare another metal-polishing liquid. The metal-polishing liquid thus prepared herein was used to carry out CMP under the same condition as in Example 1. The CMP rate was 252 nm/min and the etching rate was 0.6 nm/min, and these were both good. And, no differences in the CMP rate and also in the etching rate due to change of the metal-polishing liquid material caused by the passage of time were found. Further, neither erosion nor scratches were found.

Example 8

A metal-polishing liquid was prepared in the same manner as in Example 2. In this however, the solution B and 10 parts by weight of colloidal silica having a mean particle size of 48 nm were added to the solution A to prepare a material for the polishing liquid.

The metal-polishing liquid thus prepared herein was used to carry out CMP under the same condition as in Example 1. The CMP rate was 250 nm/min and the etching rate was 0.5 nm/min, and these were both good. And, no differences in the CMP rate and also in the etching rate due to change of the metal-polishing liquid material caused by the passage of time were found. Further, neither erosion nor scratches were found.

Example 9

The metal-polishing liquid of Example 1 was used to carry out CMP under the same condition as in Example 1. In this, however, the metal-polishing liquid was prepared by mixing the ingredients in the pipe line. Concretely, a diluted liquid prepared by diluting 7 parts by weight of the 10-fold concentrate for the metal-polishing liquid with 63 parts by weight of water added thereto, and aqueous hydrogen peroxide (special-grade chemical, aqueous 30% solution) were put into different tanks, and these were separately fed into different pipe lines via different metering pumps, and mixed at the junction of the two pipe lines, in a flow rate ratio (by volume) of diluted liquid/aqueous hydrogen peroxide of 7/3. With that, the resulting mixture was introduced into a pipe line filled with a large number of glass tubes of 3 mm in length, and then fed to the polishing pad in the apparatus, to carry out the polishing.

As a result, the CMP rate was 129 nm/min and the etching rate was 0.5 nm/min, and these were both good. And, no differences in the CMP rate and also in the etching rate due to change of the metal-polishing liquid material caused by the passage of time were found. Further, neither erosion nor scratches were found.

Example 10

The metal-polishing liquid of Example 4 was used to carry out CMP under the same condition as in Example 1. In this, however, the polishing liquid was prepared by mixing the ingredients in the pipe line. Concretely, the solution C and a mixture of the solutions F and G were put into different tanks, and these were separately fed into different pipe lines via different metering, pumps, and mixed at the junction of the two pipe lines, in a flow rate ratio (by volume) of solution C/(solution F+solution G) of 3/7. The resulting mixture was fed to the polishing pad in the apparatus.

As a result, the CMP rate was 125 nm/min and the etching rate was 0.4 nm/min, and these were both good. And, no differences in the CMP rate and also in the etching rate due to change of the metal-polishing liquid material caused by the passage of time were found. Further, neither erosion nor scratches were found.

Example 11

A metal-polishing liquid was prepared in the same manner as in Example 1, except that the amount of ethanol used in preparing the 10-fold concentrate for the metal-polishing liquid in Example 1 was increased from 5 parts by weight to 50 parts by weight. This was used to carry out CMP, and the etching rate was 0.5 nm/min and the CMP rate was 62 nm/min.

Example 12

(1) Preparation of Metal-Polishing Liquid Material

First, 66 parts by weight of water was added to 2 parts by weight of benzotriazole serving as a protective film-forming agent, and 0.4 part by weight of polyoxyethylene(10) glycol serving as a surfactant was added thereto. These were stirred with a stirring blades in a warm water bath at 40° C., and dissolved, 1.5 parts by weight of DL-malic acid (special-grade chemical) serving as an oxidized-metal etchant was added to and dissolved in the resulting solution to prepare a 10-fold concentrate of a metal-polishing liquid which corresponds to the material for the metal-polishing liquid.

When stored at 0° C., the concentrate did not form a deposit therein.

(2) Preparation of Metal-Polishing Liquid 7 parts by weight of the 10-fold concentrate for the metal-polishing liquid was diluted with 63 parts by weight of water serving as a diluent, to which was added 33.2 parts by weight of aqueous hydrogen peroxide (special-grade chemical, aqueous 30% solution) serving as an oxidizing agent to prepare a metal-polishing liquid.

(3) CMP Test

The resultant metal-polishing liquid was used to carry out CMP under the same condition as in Example 1. The CMP rate was 187 nm/min and the etching rate was 0.7 nm/min, and these were both good. And, no differences in the CMP rate and also in the etching rate due to change of the metal-polishing liquid material caused by the passage of time were found. Further, neither erosion nor scratches were found.

Example 13

66 parts by weight of water was added to 2 parts by weight of tolyltriazole serving as a protective film-forming agent, and then 0.4 part by weight of polyoxyethylene(9) octylphenyl ether also serving as a protective film-forming agent was added thereto. These were stirred with a stirring blades in a warm water bath at 40° C., and dissolved 1.5 parts by weight of DL-tartaric acid (special-grade chemical) was added to and dissolved in the resulting solution to prepare a 10-fold concentrate of a metal-polishing liquid which corresponds to the material for the metal-polishing liquid.

(2) Preparation of Metal-Polishing Liquid 7 parts by weight of the resultant 10-fold concentrate for the metal-polishing liquid was diluted with 63 parts by weight of water, to which was added 33.2 parts by weight of aqueous hydrogen peroxide (special-grade chemical, aqueous 30% solution) to prepare a metal-polishing liquid.

(3) CMP Test

The metal-polishing liquid was used to carry out CMP under the same condition as in Example 1. The CMP rate was 186 nm/min and the etching rate was 0.3 nm/min, and these were both good. And, no differences in the CMP rate and also in the etching rate due to change of the metal-polishing liquid material caused by the passage of time were found. Further, neither erosion nor scratches were found.

Example 14

(1) Preparation of Metal-Polishing Liquid Material 0.05 part by weight of benzotriazole serving as a protective film-forming agent, 0.1 part by weight of ammonium butylsulfate serving as a surfactant, and 10 parts by weight of potassium periodate serving as an oxidizing agent were added to 20 parts by weight of water. These were stirred with stirring blades in a warm water bath at 40° C. and dissolved to prepare a solution A.

Next, 0.05 part by weight of DL-tartaric acid (special-grade chemical) serving as an oxidized-metal etchant was dissolved in 30 parts by weight of water added thereto, and 0.15 part by weight of a benzotriazole serving as a protective film-forming agent and 0.1 parts by weight of ammonium butylsulfate serving as a surfactant were added thereto. These were stirred with stirring blades in a warm water bath at 40° C. and dissolved to prepare a solution B.

In the manner as above, prepared were the solutions A and B for the material for a metal-polishing liquid. On the other hand, 0.1 part by weight of DL-tartaric acid was dissolved in 40 parts by weight of water added thereto, to prepare an aqueous diluent solution.

(2) Preparation of Metal-Polishing Liquid

The solutions A, B and the aqueous diluent solution prepared in the above were mixed in a ratio by weight of 3/3/4 to prepare a metal-polishing liquid.

(3) CMP Test

The metal-polishing liquid was used to carry out CMP under the same condition as in Example 1. The CMP rate was 126 nm/min and the etching rate was 0.4 nm/min, and these were both good. And, no differences in the CMP rate and also in the etching rate due to change of the metal-polishing liquid material caused by the passage of time were found. Further, neither erosion nor scratches were found.

Example 15

(1) Preparation of Metal-Polishing Liquid Material 0.15 part by weight of DL-malic acid (special-grade chemical) was dissolved in 50 parts by weight of water added thereto. With the resulting solution being kept at 45° C., 0.2 part by weight of benzotriazole and 0.7 part by weight of a surfactant, succinamide were added thereto and dissolved therein, to prepare a solution A.

(2) Preparation of Metal-Polishing Liquid

Kept at 45° C., the solution A was diluted with 20 parts by weight of water heated at 45° C., and then 33.2 parts by weight of aqueous hydrogen peroxide (special-grade chemical, aqueous 30% solution) at 20° C. was poured thereinto to prepare a metal-polishing liquid. The temperature of the thus-prepared, metal-polishing liquid was 36° C.

(3) CMP Test

The metal-polishing liquid was used to carry out CMP under the same condition as in Example 1. The CMP rate was 127 nm/min and the etching rate was 0.3 nm/min, and these were both good. And, no differences in the CMP rate and also in the etching rate due to change of the metal-polishing liquid material caused by the passage of time were found. Further, neither erosion nor scratches were found.

Example 16

(1) Preparation of Metal-Polishing Liquid Material

A metal-polishing liquid material was prepared in the same manner as in Example 12. In this, however, benzotriazole to be used was pre-treated in the same manner as in Example 6 to have a mean particle size of 80 µm. By the pre-treatment, in this, the time for complete benzotriazole dissolution was shortened from 15 minutes to 5 minutes.

(2) Preparation of Metal-Polishing Liquid, and CMP Test

By the use of the material prepared in the above, a metal-polishing liquid was formulated in the same manner as in Example 12. This was used to carry out CMP under the same condition as in Example 1. As a result, the CMP rate was 185 nm/min and the etching rate was 0.6 nm/min, and these were both good. And, no differences in the CMP rate and also in the etching rate due to change of the metal-polishing liquid material caused by the passage of time were found. Further, neither erosion nor scratches were found.

Example 17

To the metal-polishing liquid of Example 12, further added was 1 part by weight of colloidal silica having a mean particle size of 100 nm and serving as abrasive grains, and this was dispersed in the liquid to prepare another metal-polishing liquid. The metal-polishing liquid thus prepared herein was used to carry out CMP under the same condition as in Example 1. The CMP rate was 250 nm/min and the etching rate was 0.6 nm/min, and these were both good. And, no differences in the CMP rate and also in the etching rate due to change of the metal-polishing liquid material caused by the passage of time were found. Further, neither erosion nor scratches were found.

Example 18

A metal-polishing liquid was prepared in the same manner as in Example 12. In this, however, 10 parts by weight of colloidal silica having a mean particle size of 48 nm was further added to the 10-fold concentrate for the metal-polishing liquid prepared in Example 12, to prepare another metal-polishing liquid.

The metal-polishing liquid thus prepared herein was used to carry out CMP under the same condition as in Example 1. The CMP rate was 244 nm/min and the etching rate was 0.6 nm/min, and these were both good. And, no differences in the CMP rate and also in the etching rate due to change of the metal-polishing liquid material caused by the passage of time were found. Further, neither erosion nor scratches were found.

Example 19

The metal-polishing liquid of Example 12 was used to carry out CMP under the same condition as in Example 1. In this, however, the metal-polishing liquid was prepared by mixing the ingredients in the pipe line. Concretely, a diluted liquid prepared by diluting 7 parts by weight of the 10-fold concentrate for the metal-polishing liquid with 63 parts by weight of water added thereto, and 33.2 parts by weight of aqueous hydrogen peroxide (special-grade chemical, aqueous 30% solution) were put into different tanks, and these were separately fed into different pipe lines via different metering pumps, and mixed at the junction of the two pipe lines, in a flow rate ratio (by volume) of the diluted liquid/aqueous hydrogen peroxide of 7/3. With that, the resulting mixture was introduced into a pipe line filled with a large number of glass tubes of 3 mm in length, and then fed to the polishing pad in the apparatus.

As a result, the CMP rate was 177 nm/min and the etching rate was 0.5 nm/min, and these were both good. And, no differences in the CMP rate and also in the etching rate due to change of the metal-polishing liquid material caused by the passage of time were found. Further, neither erosion nor scratches were found.

Example 20

The metal-polishing liquid of Example 14 was used to carry out CMP under the same condition as in Example 1. In this, however, the metal-polishing liquid was prepared by mixing the ingredients in the pipe line. Concretely, the solution A, and a mixture of the solution B and the aqueous diluent solution were put into different tanks, and these were separately fed into different pipe lines via different metering pumps, and mixed at the junction of the two pipe lines, in a flow rate ratio (by volume) of solution A/(solution B+aqueous diluent solution) of 3/7. The resulting mixture was fed to the polishing pad in the apparatus.

As a result, the CMP rate was 124 nm/min and the etching rate was 0.4 nm/min, and these were both good. And, no differences in the CMP rate and also in the etching rate due to change of the metal-polishing liquid material caused by the passage of time were found. Further, neither erosion nor scratches were found.

Comparative Example 1

A 10-fold concentrate for a metal-polishing liquid was prepared in the same manner as in Example 1, except that ethanol was not added thereto. When this was stored in a refrigerator at 5° C., it formed a solid precipitate therein. It could not be directly formulated into a metal-polishing liquid and therefore could not be evaluated.

Comparative Example 2

A 10-fold concentrate for a metal-polishing liquid was prepared in the same manner as in Example 12, except that polyoxyethylene(10) glycol was not added thereto, When this was stored in a refrigerator at 5° C., it formed a solid precipitate therein. It could not be directly formulated into a metal-polishing liquid and therefore could not be evaluated.

INDUSTRIAL APPLICABILITY

The invention provides a metal-polishing liquid material of high concentration. For transport, storage and the like, the high-concentration material can be used, and, when carrying out the actual polishing, a polishing liquid can be readily prepared by adding a diluent or the like to the material. Accordingly, the invention can reduce the production costs of metal-polishing liquids, and reduce the number of tanks necessary for storing and transporting metal-polishing liquids. In addition, the invention can reduce the space for storage of metal-polishing liquids, and reduce the scale of polishing devices and the volume of polishing liquid tanks and the like. According to the invention, buried metal layer patterns of high reliability can be formed. Accordingly, the invention is especially useful for fabrication and the like of semiconductor devices.

What is claimed is:

1. A polishing method, comprising:
preparing a first constituent element;
preparing a second constituent element;
preparing a diluent;
mixing the first constituent element, second constituent element and diluent at the same time or in any order to prepare a metal-polishing liquid;
applying the metal-polishing liquid to a polishing pad set on a platen; and
polishing a surface of an article to be polished with the polishing pad, by moving the polishing pad and the surface of the article relatively to each other while keeping the surface of the article in contact with the polishing pad,
wherein the metal-polishing liquid comprises an ingredient group consisting of an oxidizing agent, an oxidized-metal etchant, a protective film-forming agent and a dissolution promoter for the protective film-forming agent and water,
the first constituent element contains at least one ingredient of the ingredient group, and
the second constituent element is a concentrated liquid wherein at least one of the ingredients of the ingredient group, other than said at least one ingredient, is dissolved in water.

2. A polishing method, comprising:
preparing a first constituent element;
preparing a second constituent element;
preparing a diluent;
mixing the first constituent element, second constituent element and diluent at the same time or in any order to prepare a metal-polishing liquid;
applying the metal-polishing liquid to a polishing pad set on a platen; and
polishing a surface of an article to be polished with the polishing pad by moving the polishing pad and the surface of the article relatively to each other while keeping the surface of the article in contact with the polishing pad,
wherein the metal-polishing liquid comprises an ingredient group consisting of an oxidizing agent, an oxidized-metal etchant, a protective film-forming agent, a dissolution promoter for the protective film-forming agent and water,
the first constituent element contains the oxidizing agent, and
the second constituent element is a concentrated liquid wherein the protective film-forming agent and the dissolution promoter for the protective film-forming agent are contained therein and dissolved in water.

3. A polishing method, comprising:
preparing a first constituent element;
preparing a second constituent element;
preparing a diluent;
mixing the first constituent element, second constituent element and diluent at the same time or in any order to prepare a metal-polishing liquid;
applying the metal-polishing liquid to a polishing pad set on a platen; and
polishing a surface of an article to be polished with the polishing pad by moving the polishing pad and the surface of the article relatively to each other while keeping the surface of the article in contact with the polishing pad,
wherein the metal-polishing liquid comprises an ingredient group consisting of an oxidizing agent, an oxidized-metal etchant, a protective film-forming agent, a dissolution promoter for the protective film-forming agent and water,
the first constituent element contains the oxidizing agent, and
the second constituent element is a concentrated liquid wherein the oxidized-metal etchant, the protective film-forming agent and the dissolution promoter for the protective film-forming agent are contained therein and dissolved in water.

4. A polishing method, comprising:
preparing a first constituent element;
preparing a second constituent element;
preparing a diluent;
mixing the first constituent element, second constituent element and diluent at the same time or in any order to prepare a metal-polishing liquid;
applying the metal-polishing liquid to a polishing pad set on a platen; and
polishing a surface of an article to be polished with the polishing pad by moving the polishing pad and the surface of the article relatively to each other while keeping the surface of the article in contact with the polishing pad,
wherein the metal-polishing liquid comprises an ingredient group consisting of an oxidizing agent, an oxidized-metal etchant, a protective film-forming agent, a dissolution promoter for the protective film-forming agent and water,
the first constituent element contains the oxidizing agent, the protective film-forming agent, and the dissolution promoter for the protective film-forming agent,
the second constituent element contains the oxidized-metal etchant, the protective film-forming agent and the dissolution promoter for the protective film-forming agent, and
at least one of the first and second constituent elements is a concentrated liquid.

5. A polishing method, comprising:
preparing a first constituent element;
preparing a second constituent element;
preparing a diluent;
mixing the first constituent element, second constituent element and diluent at the same time or in any order to prepare a metal-polishing liquid;
applying the metal-polishing liquid to a polishing pad set on a platen; and
polishing a surface of an article to be polished with the polishing pad by moving the polishing pad and the surface of the article relatively to each other while keeping the surface of the article in contact with the polishing pad, wherein the metal-polishing liquid comprises an ingredient group consisting of an oxidizing agent, an oxidized-metal etchant, a protective film-forming agent, a dissolution promoter for the protective film-forming agent and water, the first constituent element contains at least one ingredient selected from a group consisting of the oxidizing agent and the oxidized-metal etchant, and the second constituent element is a concentrated liquid wherein the protective film-forming agent and the dissolution promoter for the protective film-forming agent are contained therein and dissolved in water.

6. The polishing method according to claim 5, further comprising preparing a third constituent element, wherein the third constituent element contains at least one ingredient which is not contained in the first constituent element, and is selected from a group consisting of the oxidizing agent and the oxidized-metal etchant.

7. The polishing method according to claim 6, wherein at least one of the first constituent element and the third constituent element contains the protective film-forming agent.

8. The polishing method according to claim 5, wherein the preparation of the metal-polishing liquid includes mixing the first constituent element and the second constituent element to obtain a mixture, and diluting the mixture with the diluent.

9. The polishing method according to claim 5, wherein the preparation of the metal-polishing liquid includes diluting at least one of the first constituent element and the second constituent element with the diluent.

10. The polishing method according to claim 5, wherein the diluent is water.

11. The polishing method according to claim 5, wherein the dissolution promoter for the protective film-forming agent is a surfactant.

12. The polishing method according to claim 11, wherein the surfactant is at least one selected from the group consisting of esters, ethers, polysaccharides, salts of amino acids, polycarboxylic acids, salts of polycarboxylic acids, vinyl polymers, sulfonic acids, sulfonates, and amides.

13. The polishing method according to claim 5, wherein the dissolution promoter for the protective film-forming agent is a solvent in which the solubility of the protective film-forming agent is at least 25 g/liter.

14. The polishing method according to claim 13, wherein the solvent is a good solvent of the solubility of the protective film-forming agent.

15. The polishing method according to claim 13, wherein the solvent is at least one selected from the group consisting of alcohols, ethers and ketones.

16. The polishing method according to claim 5, wherein the metal-polishing liquid further comprises abrasive grains.

17. The polishing method according to claim 5, wherein said article includes a metal film coating a substrate, and wherein the surface of the article to be polished is a surface of the metal film.

18. The polishing method according to claim 17, wherein the metal film is a metal film containing copper.

19. The polishing method according to claim 1, wherein the preparation of the metal-polishing liquid includes mixing the first constituent element and the second constituent element to obtain a mixture, and diluting the mixture with the diluent.

20. The polishing method according to claim 1, wherein the preparation of the metal-polishing liquid includes diluting at least one of the first constituent element and the second constituent element with the diluent.

21. The polishing method according to claim 1, wherein the diluent is water.

22. The polishing method according to claim 1, wherein the dissolution promoter for the protective film-forming agent is a surfactant.

23. The polishing method according to claim 22, wherein the surfactant is at least one selected from the group consisting of esters, ethers, polysaccharides, salts of amino acids, polycarboxylic acids, salts of polycarboxylic acids, vinyl polymers, sulfonic acids, sulfonates, and amides.

24. The polishing method according to claim 1, wherein the dissolution promoter for the protective film-forming agent is a solvent in which the solubility of the protective film-forming agent is at least 25 g/liter.

25. The polishing method according to claim 24, wherein the solvent is a good solvent of the solubility of the protective film-forming agent.

26. The polishing method according to claim 24, wherein the solvent is at least one selected from the group consisting of alcohols, ethers and ketones.

27. The polishing method according to claim 1, wherein the metal-polishing liquid further comprises abrasive grains.

28. The polishing method according to claim 1, wherein said article includes a metal film coating a substrate, and wherein the surface of the article to be polished is a surface of the metal film.

29. The polishing method according to claim 28, wherein the metal film is a metal film containing copper.

30. The polishing method according to claim 4, wherein said article includes a metal film coating a substrate, and wherein the surface of the article to be polished is a surface of the metal film.

31. The polishing method according to claim 30, wherein the metal film is a metal film containing copper.

32. The polishing method according to claim 3, wherein said article includes a metal film coating a substrate, and wherein the surface of the article to be polished is a surface of the metal film.

33. The polishing method according to claim 32, wherein the metal film is a metal film containing copper.

34. The polishing method according to claim 2, wherein said article includes a metal film coating a substrate, and wherein the surface of the article to be polished is a surface of the metal film.

35. The polishing method according to claim 34, wherein the metal film is a metal film containing copper.

* * * * *